United States Patent
Na et al.

(10) Patent No.: US 8,570,058 B2
(45) Date of Patent: Oct. 29, 2013

(54) CARRIER BOARD TRANSFER SYSTEM FOR HANDLER THAT SUPPORTS TESTING OF ELECTRONIC DEVICES AND METHOD FOR TRANSFERRING CARRIER BOARD IN CHAMBER OF HANDLER

(75) Inventors: Yun-Sung Na, Cheonan-Si (KR); In-Gu Jeon, Suwon (KR); Dong-Hyun Yo, Bucheon-Si (KR); Young-Ho Kweon, Gunpo Si (KR); Hoyung-Su Kim, Hwaseong Si (KR)

(73) Assignee: TechWing Co., Ltd., Hwaseong-Si (KR)

( * ) Notice: Subject to any disclaimer, the term of this patent is extended or adjusted under 35 U.S.C. 154(b) by 688 days.

(21) Appl. No.: 12/745,053

(22) PCT Filed: Jan. 19, 2009

(86) PCT No.: PCT/KR2009/000281
§ 371 (c)(1),
(2), (4) Date: May 27, 2010

(87) PCT Pub. No.: WO2009/096675
PCT Pub. Date: Aug. 6, 2009

(65) Prior Publication Data
US 2010/0303588 A1 Dec. 2, 2010

(30) Foreign Application Priority Data
Jan. 29, 2008 (KR) .................. 10-2008-0009179

(51) Int. Cl.
*G01R 31/20* (2006.01)
*G01R 31/00* (2006.01)

(52) U.S. Cl.
USPC ............ 324/757.02; 324/750.19; 324/757.01; 414/331.02

(58) Field of Classification Search
USPC ............ 324/750.19, 750.25, 757.01, 757.02; 414/222.01, 222.13, 225.01, 226.01, 414/331.2, 331.03, 331.04, 331.11, 331.14, 414/589, 626, 637, 732, 738, 222.12, 414/331.02, 591
See application file for complete search history.

(56) References Cited

U.S. PATENT DOCUMENTS

| | | | | |
|---|---|---|---|---|
| 5,169,271 A * | 12/1992 | Yamashita | .................. | 294/81.52 |
| 5,664,927 A * | 9/1997 | Takeuchi | .................. | 414/225.01 |
| 6,435,804 B1 * | 8/2002 | Hutchins | .................. | 414/540 |
| 6,445,201 B1 * | 9/2002 | Simizu et al. | ............ | 324/750.02 |
| 6,507,185 B1 * | 1/2003 | Hennekes et al. | ........ | 324/750.25 |
| 6,558,106 B2 * | 5/2003 | Sardonico | .................... | 414/556 |
| 6,607,071 B1 | 8/2003 | An et al. | | |
| 6,784,657 B2 * | 8/2004 | Fujishiro et al. | .......... | 324/750.21 |

(Continued)

FOREIGN PATENT DOCUMENTS

| | | |
|---|---|---|
| JP | 2000-46908 A | 2/2000 |
| KR | 10-2000-0026232 A | 5/2000 |
| KR | 10-2000-0066390 A | 11/2000 |
| KR | 10-2002-0000926 A | 1/2002 |

(Continued)

*Primary Examiner* — Scott Lowe
(74) *Attorney, Agent, or Firm* — Jefferson IP Law, LLP

(57) ABSTRACT

A system and method is disclosed that transfers carrier boards in a handler that supports the testing of electronic devices. A carrier board can be transferred from the transfer start position to one of the mid transfer positions and the transfer final position. Carrier boards, which are spaced apart from each other in a chamber, can be gathered adjacent to each other in the circulation direction of carrier board. The transfer speed and the total circulation speed of the carrier boards can be enhanced. The transfer speed of carrier board can be easily controlled according to the test conditions.

8 Claims, 19 Drawing Sheets

(56) References Cited

U.S. PATENT DOCUMENTS

| | | | |
|---|---|---|---|
| 6,843,635 B2 * | 1/2005 | Cohn | 414/549 |
| 6,964,276 B2 * | 11/2005 | Shulman et al. | 134/133 |
| 7,332,918 B2 * | 2/2008 | Sugiyama et al. | 324/750.03 |
| 8,154,314 B2 | 4/2012 | Shim et al. | |
| 2008/0001145 A1 | 1/2008 | Chu et al. | |

FOREIGN PATENT DOCUMENTS

| | | |
|---|---|---|
| KR | 10-2002-0036553 A | 5/2002 |
| KR | 10-2004-0013510 A | 2/2004 |
| KR | 10-0771475 B1 | 10/2007 |
| KR | 10-2007-0112942 A | 11/2007 |

\* cited by examiner

CARRIER BOARD TRANSFER SYSTEM FOR HANDLER THAT SUPPORTS TESTING OF ELECTRONIC DEVICES AND METHOD FOR TRANSFERRING CARRIER BOARD IN CHAMBER OF HANDLER

TECHNICAL FIELD

The present invention relates to a handler for supporting testing of electronic devices and, more particularly, to a technology for transferring carrier boards.

BACKGROUND ART

There are a variety of handlers for supporting a tester to test electronic devices, such as a handler for supporting the testing of semiconductor devices in a package state, a handler for supporting the testing of module RAM's, etc.

In general, a handler circulates carrier boards (comprising test trays), on which a plurality of electronic devices are loaded, on a preset circulation path, so that the electronic devices loaded on the carrier board can be tested. On the preset circulation path, there is a test site where the electronic devices loaded on the carrier board are electrically connected to a tester and then tested.

The electronic devices are assimilated to and tested under artificially prepared test conditions. Therefore, the handler applies to stress to the electronic devices according to test conditions and then electrically connects them to the tester. To this end, the handler includes a chamber that applies stress to electronic devices according to the test conditions and thermally blocks external air, so that the electronic devices can be tested in an environment where the stress applied to the electronic devices is maintained.

The handler may include a plurality of chambers. For example, a handler having a function of applying temperature stress to electronic devices may include a soak chamber, a test chamber, and a de-soak chamber. The soak chamber pre-heats/pre-cools electronic devices before a carrier board is transferred to a test site. The test chamber maintains the temperature of the electronic devices pre-heated/pre-cooled in the soak chamber and allows them to be tested. The de-soak chamber restores the temperature of the electronic devices, loaded on the carrier board transferred from the test chamber, to close to room temperature. The soak chamber is also called a pre-heating chamber, a heating chamber, a frost chamber, a pre-heater, etc. The de-soak chamber is also called a restoring chamber, a cooling chamber, a de-frost chamber, a de-froster, etc. This technology has been published through a plurality of documents.

As such, when the handler is configured to include chambers, the inside of the chambers becomes a portion of the circulation path for the carrier board. Therefore, the handler requires a method for transferring a carrier board through the inside of the chamber and is also equipped with a transfer system adapted to the transfer method.

DISCLOSURE OF INVENTION

Technical Problem

A technology related to a method for transferring a carrier board in the inside of a chamber and a carrier board transfer system has been disclosed in: Korean Patent No. 10-0277539 entitled "CHAMBER OF MODULE IC HANDLER", which is called Conventional art 1; Korean Patent No. 10-0313007 entitled "TEST TRAY TRANSFER APPARATUS IN HANDLER COOLING CHAMBER", which is called Conventional art 2; Korean Patent No. 10-0771475 entitled "SIDE DOCKING-TYPE TEST HANDLER AND APPARATUS FOR TRANSFERRING TEST TRAY FOR THE SAME", which is called Conventional art 3; and Korean Patent No. 10-0792732 entitled "TEST TRAY TRANSFER APPARATUS OF TEST HANDLER FOR SEMI-CONDUCTOR DEVICES", which is called Conventional art 4.

Conventional art 1 is related to a method and a system that transfers a carrier board step by step within the chamber. In Conventional art 1, the carrier board is expressed as a carrier. Such step by step method for transferring a carrier board disclosed in Conventional art 1 is just a general method that transfers a carrier board in the inside of the chamber. Here, the term, step by step, means that there is a transfer stop time period, when the transfer of a carrier board is stopped, between transfer operations. This transfer stop time period does not relate to a time period when electronic devices are loaded onto a carrier board, a time period when electronic devices loaded onto the carrier board are tested, and a time period when electronic devices are unloaded from the carrier board.

The technology disclosed in Conventional art 1 should secure the transfer stop time period while the carrier board is transferring, and consequently transfer of the carrier board is delayed by that time period. Therefore, regarding a case where a relatively short circulation time period is required, Conventional art 1 has a limitation in terms of its ability to enhance the transfer speed of a carrier board and the total circulation speed. The case where a relatively short circulation time period is required means that the state of electronic devices required by test conditions should arrive at an environment inside the chamber within a relatively short time period and a carrier board should be rapidly circulated due to a relatively short test time period.

In particular, Conventional art 1 has disadvantages in that, although there is no carrier board between two carrier boards (preceding carrier board and following carrier board) and there is a space to place a carrier board between the preceding carrier board and the following carrier board, the following carrier board cannot be transferred and placed close to the preceding carrier board, which causes a limitation in terms of enhancing the transfer speed of a carrier board and the total circulation speed.

In Conventional 2, the transfer system is operated in such a way that it can receive a new carrier board in a lowering operation while a preceding carrier board (expressed as a test tray in Conventional art 2) is transferring, then perform a successive transfer operation for the newly lowered carrier board, i.e., a following carrier board, to place it close to the preceding carrier board. However, the transfer system is configured to still have a limitation in terms of securing a transfer stop time period between transfer operations, which also causes the problem described in Conventional art 1.

Conventional arts 3 and 4 are proposed to resolve the problems in Conventional arts 1 and 2, i.e., eliminating the transfer stop time period.

In Conventional art 3, since an endless track unit transfers a carrier board (expressed as a test tray in Conventional art 3) to a transfer termination site without a transfer stop time period, the system can enhance the transfer speed of carrier board and the total circulation speed.

However, the system of Conventional art 3 has still disadvantages in that, in a state where a pick-and-place unit, which is currently located at the lowest side of an endless track unit, picks up a preceding carrier board circulating on the circulation path, and a vertical-posture-change apparatus cannot be operated, if a following carrier board, which circulates on the circulation path following the preceding carrier board, is provided to a pick-and-place unit, which is currently located at the highest side of the endless track unit by a tray placement apparatus, it is impossible to gather the preceding carrier board and the following carrier board close to each other in the circulating direction. Therefore, the system of Conventional art 3 has a limitation in enhancing the transfer speed of the carrier board and the total circulation speed. Here, gathering the preceding carrier board and the following carrier board close to each other in the circulating direction means that the preceding carrier board maintains its current position and the following carrier board is previously transferred to a position close to the preceding carrier board.

In Conventional art 4, the system is configured in such a way that a carrier board (expressed as a test tray in Conventional art 4) is transferred by the rotation of a transfer bar and a transfer stop time period may or may not occur according to the method of controlling the servo motor.

However, the system of Conventional art 4 still has the problems of Conventional art 3.

Technical Solution

The present invention solves the above problems, and provides a carrier board transfer system and method that can perform step by step transfer operations, while eliminating a transfer stop time period according to conditions, and gathering carrier boards, which are spaced apart from each other in the chamber, close to each other in the carrier board transfer direction.

In accordance with an exemplary embodiment of the present invention, the present invention provides a system for transferring a carrier board in a handler that supports the testing of electronic devices, comprising: an transfer apparatus for transferring the carrier board at a transfer start position selectively to one of at least one or more mid transfer positions and a transfer final position; and at least one or more supporting apparatuses for supporting or releasing the carrier board located at the at least one or more mid transfer positions.

Preferably, the system further comprises a guide apparatus for guiding the carrier board transferred to the transfer start position and supporting or releasing the carrier board located at the transfer start position.

Preferably, the system further comprises a sustaining apparatus for sustaining a carrier board at the transfer final position.

Preferably, the system further comprises: a supporting plate, fixed to the system, for supporting one side border portion of the carrier board. The supporting apparatus comprises: a supporting member for supporting or releasing the other side border portion of the carrier board; and a mover for moving the supporting member in a direction to or from the carrier board.

Preferably, if the system has a plurality of the supporting apparatuses, the supporting apparatuses are operated, independently and respectively.

Preferably, the transfer apparatus comprises: at least two or more picking-up units for picking up or releasing the carrier board; and a transfer unit for transferring the at least two or more picking-up units in a transfer direction of the carrier board so that the carrier board, picked up by the at least two or more picking-up units, can be transferred selectively to one of the at least one or more mid transfer positions and the transfer final position.

Preferably, the picking-up unit includes: a picking-up shaft having a relatively long length in the transfer direction of carrier board; and a drive source for rotating the picking-up shaft, within a certain range of angle, in the forward or reverse direction. The picking-up shaft is configured in such a way that its one end is coupled to the drive source and its other end includes at least one or more picking-up ends that are protruded to support the border portions or corners of the carrier board.

Preferably, the transfer unit includes: a screw shaft having a relatively long length in the transfer direction of carrier board; a motor for rotating the screw shaft, within a certain range of angle, in the forward or reverse direction; and a coupling plate. The coupling plate is coupled to the screw shaft in a screw manner and reciprocated in the transfer direction of carrier board according to the rotation of the screw shaft. Also, the at least two or more picking-up units are coupled to the coupling plate.

In accordance with another exemplary embodiment of the present invention, the present invention provides a method for transferring a carrier board within a chamber of a handler that supports testing of electronic devices, comprising: transferring the carrier board at a transfer start position selectively to one of at least one or more mid transfer positions and a transfer final position. If a preceding carrier board is located at the transfer final location, a following carrier board at the transfer start position is transferred to the at least one or more mid transfer positions.

Preferably, the carrier board is transferred in a direction perpendicular to a loading surface of the carrier board onto which the electronic devices are loaded.

In accordance with another exemplary embodiment of the present invention, the present invention provides an apparatus for supporting a carrier board in a handler that supports testing of electronic devices, comprising: a first supporting part for supporting or releasing one side border portion of the carrier board; and a second supporting part for supporting or releasing the other side border portion of the carrier board. Here, the second supporting part comprises: a supporting member for supporting the other side border portion of the carrier board; and a mover for moving the supporting member in a direction to or from the carrier board. The mover comprises: a rotational shaft having a relatively long length in the transfer direction of carrier board; a rotational member whose one end is fixed to the rotational shaft and whose other end is rotatably coupled to the supporting member, wherein the other end is rotated with respect to the one end according to rotation of the rotational shaft; and a drive source for rotating the rotational shaft, within a certain range of angle, in the forward or reverse direction, in a reciprocating motion.

Preferably, the mover further comprises an auxiliary unit for assisting the supporting member to move in a balanced manner according to the rotation of the rotational shaft.

Advantageous Effects

As described in the foregoing, since the system according to the present invention may or may not have a transfer stop time period according to a condition and can gather carrier boards, which are spaced apart from each other in the chamber, close to each other in the circulation direction of the carrier boards, it has the following effects:

First, it can enhance the transfer speed of carrier board and the total circulation speed.

Second, it can control the transfer speed of carrier board so that the carrier boards can be transferred rapidly or slowly according to test conditions.

BRIEF DESCRIPTION OF DRAWINGS

The features and advantages of the present invention will be more apparent from the following detailed description in conjunction with the accompanying drawings, in which.

BRIEF DESCRIPTION OF SYMBOLS IN THE DRAWINGS

2000: carrier board transfer system
2100: guide apparatus
2200: transfer apparatus
2300: first supporting apparatus
2400: second supporting apparatus
2500: sustaining apparatus

BEST MODE FOR CARRYING OUT THE INVENTION

Hereinafter, exemplary embodiments of a carrier board transfer system for a handler that supports testing electronic devices, which is shortly called a transfer system, and a method for transferring carrier boards within a chamber of a hander that supports testing of electronic devices, which is shortly called a transfer method, are explained in detail with reference to the accompanying drawings. A detailed description for the duplicated elements may be omitted to avoid obscuring the subject matter of the present invention.

Embodiment 1

Figure 1:
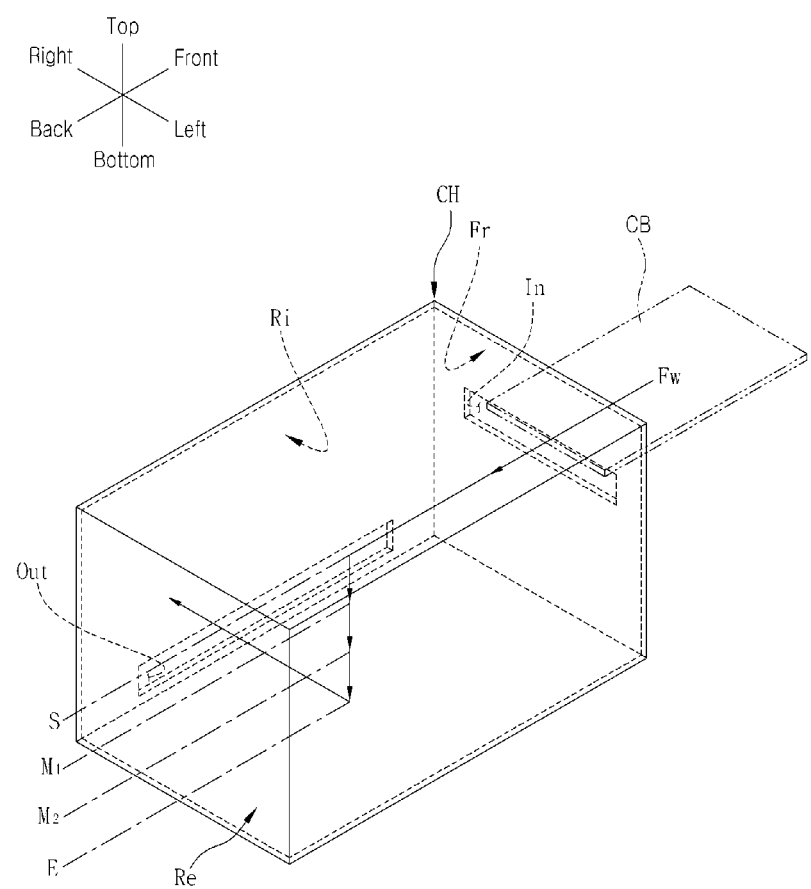
FIG. 1 is a schematic perspective view illustrating a chamber to which a carrier board transfer method according to a first embodiment of the present invention is applied.

FIG. 1 shows a chamber CH where a carrier board CB is transferred at the transfer section, along the transfer flow Fw indicated by the arrow, maintaining its horizontal state.

Referring to FIG. 1, the carrier board CB enters an upper portion of a front side wall Fr of the chamber CH and is located at a transfer start position S. The transfer system according to the present invention starts to transfer the carrier board CB from the transfer start position S. That is, the transfer system starts to transfer the carrier board CB from the transfer start position S, lowers it through a first mid position $M_1$ and a second mid position $M_2$, and stops the carrier board transfer at a transfer final position E where the transfer of the carrier board CB is terminated. The carrier board CB is output from the transfer final position E through a lower portion of a right side wall Ri of the chamber CH to the outside.

In order to make it to transfer the carrier board CB along the transfer flow Fw as shown in FIG. 1, the chamber CH includes an inlet at the upper portion of the front side wall Fr thereof and an outlet at the lower portion of the right side wall Ri thereof. The inlet is implemented in such a way to be opened or closed by a door (not shown). The carrier board CB enters the inlet and is output through the outlet.

The outlet may be implemented in such a way to be opened or closed by a door. It is, however, preferable that the outlet of the chamber CH does not have a door if another chamber is adjacently installed right to the chamber CH.

The carrier board CB is input to the inlet and output from the outlet by the other transfer apparatuses that are not parts of the transfer system of the present invention. Since these transfer apparatuses are already well known, they are not explained in this application.

Figure 2:
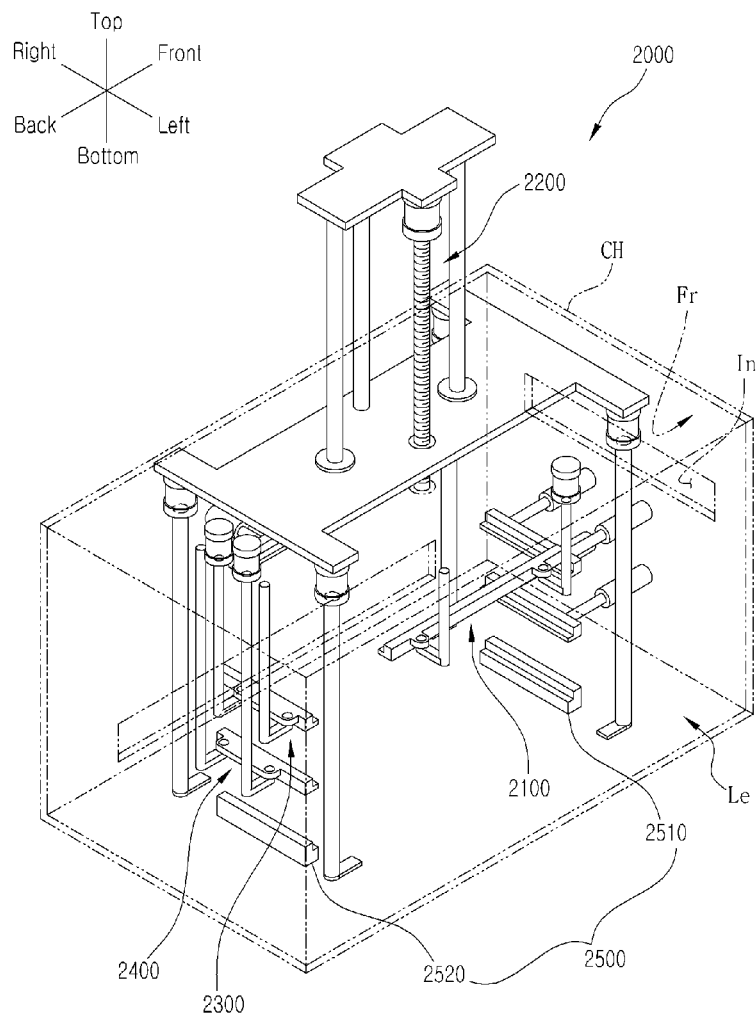
FIG. 2 is a schematic perspective view illustrating a carrier board transfer system according to a first embodiment of the present invention.

FIG. 2 is a perspective view illustrating a carrier board transfer system 2000 that transfers a carrier board CB within the chamber CH of FIG. 1.

As shown in FIG. 2, the transfer system 2000 according to an embodiment of the present invention is installed inside and outside the chamber CH. It is configured to include a guide apparatus 2100, a transfer apparatus 2200, a first supporting apparatus 2300, a second supporting apparatus 2400, and a sustaining apparatus 2500.

1. Guide Apparatus 2100

Figure 3:
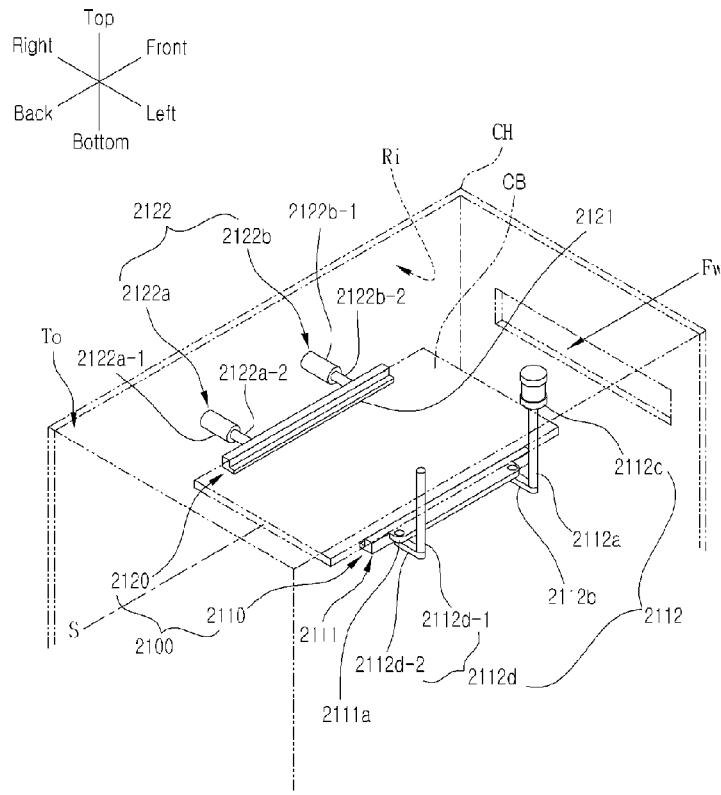
FIG. 3 is a perspective view illustrating a primary portion of a guide apparatus adapted to the carrier board transfer system of FIG. 2.

The guide apparatus 2100 guides a carrier board CB from outside the chamber CH to the transfer start position S in the chamber CH and then supports or releases the carrier board CB at or from the transfer start position S. To this end, as shown in FIG. 3, the guide apparatus 2100 is configured to include a first guide rail part 2110 for guiding and supporting the left side of the carrier board CB and a second guide rail part 2120 for guiding and supporting the right side of the carrier board CB. The first and second guide rail parts 2110 and 2120 are located at opposite sides (left and right sides) of the guide apparatus 2100.

The first guide rail part 2110 includes a first guide rail 2111 and a first spacing regulator 2112.

The first guide rail 2111 guides the left side of the carrier board CB being currently entered and supports the left side of the carrier board CB located at the transfer start position S to prevent the carrier board from dropping down. The first guide rail 2110 has a coupling end 2111a protruded in the left direction.

The first spacing regulator 2112 allows the first guide rail 2111 to support or release the left side of the carrier board CB. The first spacing regulator 2112 is configured to include a spacing regulating shaft 2112a, a spacing regulating member 2112b, a drive source 2112c, and an auxiliary unit 2112d.

The spacing regulating shaft 2112a has a relatively long length in the transfer direction of the carrier board CB, i.e. up and down. The spacing regulating shaft 2112a is rotated in the forward or reverse direction, within a certain range of angle, by the drive source 2112c whose upper end is installed to the top side wall To of the chamber CH.

The spacing regulating member 2112b is configured in such a way that its left end is fixed to or integrally formed with the lower end of the spacing regulating shaft 2112a and its right end is rotatably coupled to the coupling end 2111a. When the drive source 2112c operates so that the spacing regulating shaft 2112a is rotated in the forward or reverse direction, the right end of the spacing regulating member 2112b is also rotated in the forward or reverse direction, with a certain range of angle, with respect to the left end of the spacing regulating member 2112b.

The drive source 2112c is installed to the top side wall To of the chamber CH outside. The drive source 2112c rotates the spacing regulating shaft 2112a in the forward or reverse direction, within a certain range of angle. In an embodiment of the present invention, the drive source 2112c is implemented with a motor, it should be understood that the present invention is not limited to the embodiment. For example, the drive source may be implemented with a cylinder.

The auxiliary unit 2112d assists the first guide rail 2111 to move in a balanced manner according to the rotation of the spacing regulating shaft 2112a. The auxiliary unit 2112d is configured to include an auxiliary shaft 2112d-1 and an auxiliary member 2112d-2.

The auxiliary shaft 2112d-1 is configured in such a way that it is located, in parallel with, and spaced apart from the spacing regulating shaft 2112a at a certain distance, and its upper end is rotatably coupled to the top side wall To of the chamber CH.

The auxiliary member 2112d-2 corresponds to the spacing regulating member 2112b and is configured in such a way that its left end is fixed to the lower end of the auxiliary shaft 2112d-1 and its right end is rotatably coupled to the coupling end 2111a of the first guide rail 2111.

The second guide rail part 2120 is configured to include a second guide rail 2121 and a second spacing regulator 2122.

The second guide rail 2121 guides the right side of the carrier board CB being currently entered and supports the right side of the carrier board CB located at the transfer start position S after the entrance to prevent the carrier board from dropping down.

The second spacing regulator 2122 allows the second guide rail 2121 to support or release the right side of the carrier board CB. The second spacing regulator 2122 includes a pair of cylinders 2122a and 2122b that are installed spaced apart from each other at a certain distance.

The pair of cylinders 2122a and 2122b are configured in such a way that their cylinder bodies 2122a-1 and 2122b-1 are installed to the right side wall Ri of the chamber CH outside and their cylinder rods 2122a-2 and 2122b-2 are extended through the right side wall Ri of the chamber CH and coupled to the second guide rail 2121. In an embodiment of the present invention, although the second guide rail part 2120 is configured in a relatively simpler manner than the first guide rail part 2120, it should be understood that they can be configured to have the same configuration according to the use state of the right side wall of the chamber CH, the transfer manner of the carrier board CB, the configuration of the other apparatuses installed to the right space of the chamber CH, etc.

In the following description, the operation of the guide apparatus 2100 is described.

Figure 4:
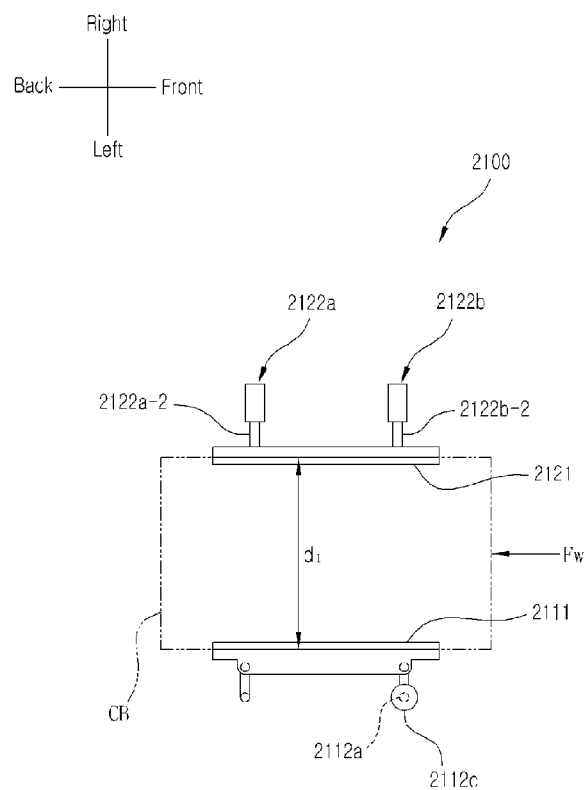
FIG. 4 and FIG. 5 are views illustrating the operation state of the guide apparatus of FIG. 3.
Figure 5:
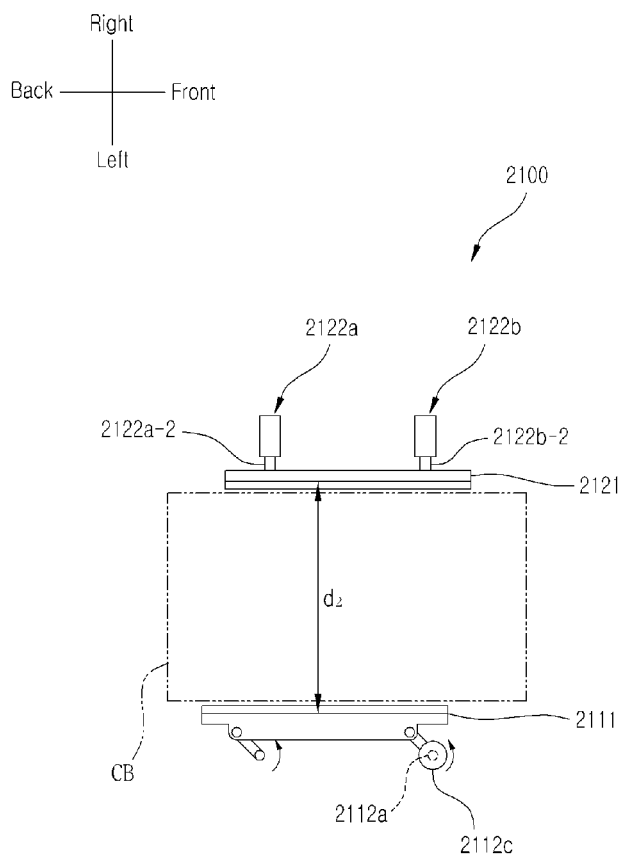

FIG. 4 and FIG. 5 are views illustrating the operation state of the guide apparatus 2100 of FIG. 3, seen from the top.

As shown in FIG. 4, in a state where the distance $d_1$ between the first and second guide rails 2111 and 2121 is relatively reduced (i.e., narrow), the carrier board CB is guided by the first and second guide rails 2111 and 2121 and then located at the transfer start position.

After that, as shown in FIG. 5, when the carrier board CB is supported by the transfer apparatus 2200 which will be described later, the drive source 2112c operates to rotate the spacing regulating shaft 2112a in the forward direction (see the arrow direction), so that the transfer apparatus 2200 lowers the carrier board CB, and the pair of cylinders 2122a and 2122b operate to pull the cylinder rods 2122a-2 and 2122b-2 back, so that the distance $d_2$ between the first and second guide rails 2111 and 2121 is widened and thus the support of the carrier board CB is released.

In addition, the transfer apparatus 2200 lowers the carrier board CB from the transfer start position S, the pair of cylinders 2122a and 2122b and the drive source 2112c are reversely operated to guide and support a carrier board CB following the carrier board CB, then the distance between the first and second guide rails 2111 and 2121 is reduced, so that the state as shown in FIG. 5 becomes the state as shown in FIG. 4.

2. Transfer Apparatus 2200

Figure 6:
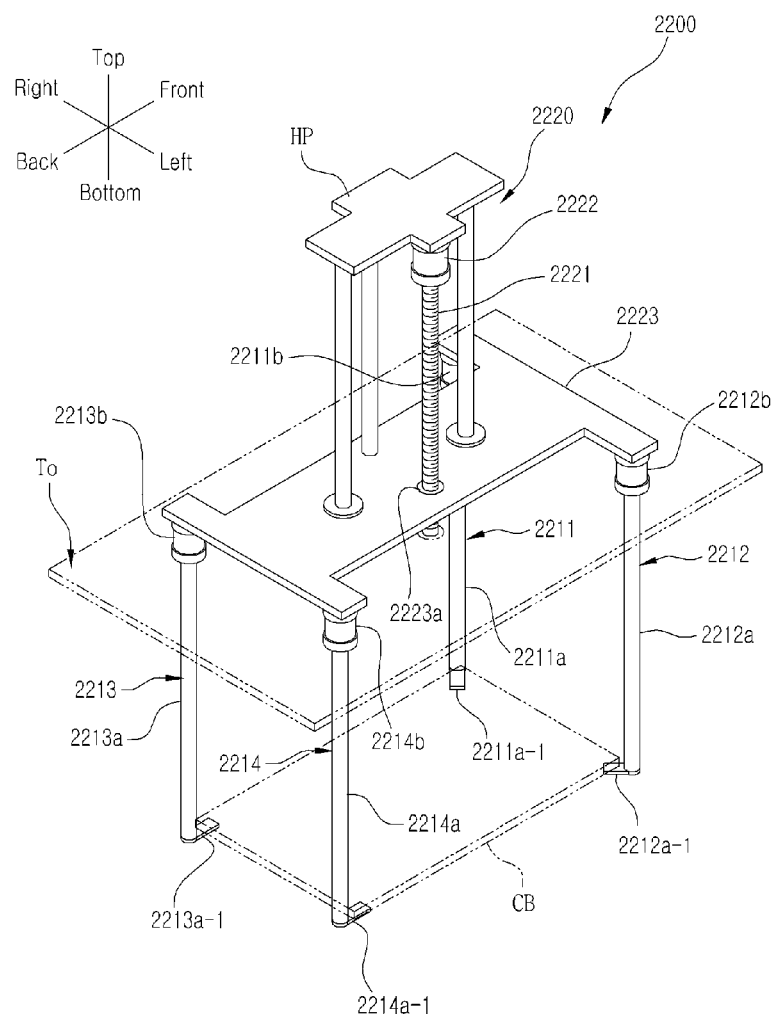
FIG. 6 is a perspective view illustrating a primary portion of a transfer apparatus adapted to the carrier board transfer system of FIG. 2.

The transfer apparatus 2200 lowers a carrier board CB from the transfer start position to the transfer final position. To this end, as shown in FIG. 6, the transfer apparatus 2200 includes a pair of picking-up units 2211 and 2212 located at its front side, a pair of picking-up units 2213 and 2214 located at its back side, and a transfer unit 2220.

The four picking-up units 2211, 2212, 2213 and 2214 include picking-up shafts 2211a, 2212a, 2213a and 2214a and drive sources 2211b, 2212b, 2213b, and 2214b, correspondingly and respectively. The transfer unit 2220 is configured to include a screw shaft 2221, a motor 2222, and a coupling plate 2223.

The picking-up shafts 2211a, 2212a, 2213a and 2214a have each a relatively long length in the vertical direction, extending through the top side wall To of the chamber CH. They have picking-up ends 2211a-1, 2212a-1, 2213a-1, and 2214a-1 at their lower ends, correspondingly and respectively, which are protrudently formed to support the border portions or corners of the carrier board CB.

The drive sources 2211b, 2212b, 2213b and 2214b are installed to couple to the coupling plate 2223 located at the upper side of the chamber CH. The drive sources rotate the picking-up shafts 2211a, 2212a, 2213a, and 2214a coupled thereto, within a certain range of angle, in the forward or reverse direction. In an embodiment of the present invention, although the drive sources 2211b, 2212b, 2213b and 2214b are implemented with a motor, it should be understood that they may be implemented with a cylinder. When the picking-up shafts 2211a, 2212a, 2213a, and 2214a are rotated in the forward or reverse direction according to the operation of the drive sources 2211b, 2212b, 2213b and 2214b, the picking-up ends 2211a-1, 2212a-1, 2213a-1, and 2214a-1 are also rotated in the forward or reverse direction according to the rotation of the picking-up shafts, so that the picking-up ends support or release the carrier board CB.

Although the transfer apparatus 2200 according to an embodiment of the present invention is implemented in such away to include two pair of picking-up units, i.e., four picking-up units, each of which has a picking-up end, it should be understood that, if the picking-up end has a relatively long length to hold up the border portion of a carrier board CB, the transfer apparatus 2200 can be implemented with only a pair of picking-up units located at the front and back sides thereof. Also, it should be understood that, if the picking-up end has a relatively wide area to hold up a carrier board CB, the transfer apparatus 2200 can be implemented with only a pair of picking-up units located at the left and right sides thereof.

The screw shaft 2221 has a relatively long length in the transfer direction of a carrier board CB and is configured in such a way that its lower end is rotatably coupled to the top side wall To of the chamber CH and its upper end is coupled to the motor 2222 and rotated according to the rotation of the motor 2222.

The motor 222 is fixed to the upper frame HP of the handler and rotates the screw shaft 2221 in the forward or reverse direction. It is preferable that the motor 2222 is implemented with a servo motor so that the amount of rotation can be precisely controlled.

The coupling plate 2223 is configured in such a way that: both end portions of the front and back sides are coupled to the drive sources 2211b, 2212b, 2213b and 2214b of the picking-up units 2211, 2212, 2213 and 2214; and its center has a screw hole 2223a through which the screw shaft 2221 is extended.

When the motor 2222 rotates in the forward or reverse direction, the screw shaft 2221 is also rotated and thus the coupling plate 2223 is lifted up or lowered down. Thus, two pair of picking-up units 2211, 2212, 2213, and 2214 are also lifted up or lowered down with the coupling plate 2223.

In the following description, the operation of the transfer apparatus 2200 and a method for transferring a carrier board CB are explained in detail.

Figure 7:
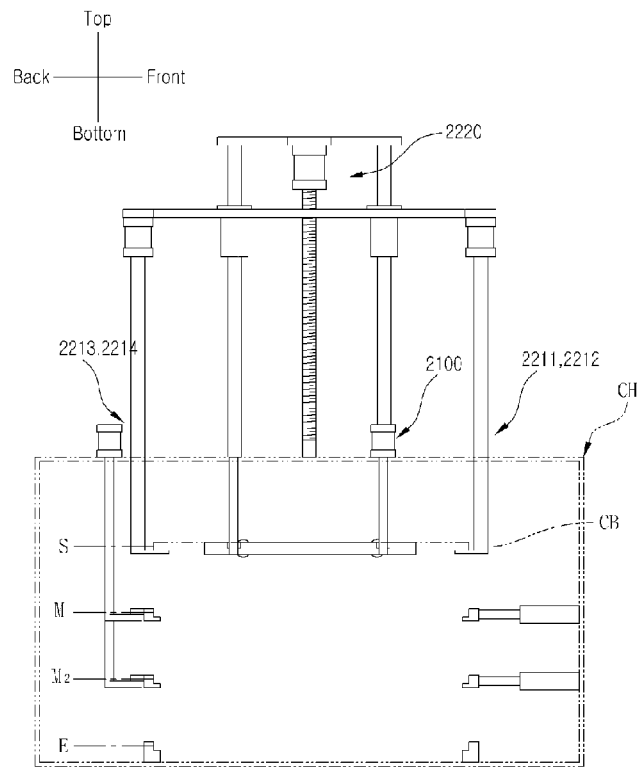
FIG. 7 to FIG. 10 show views that illustrate the operation state of the transfer apparatus of FIG. 6.

As shown in FIG. 7, when the guide apparatus 2100 supports the carrier board CB at the transfer start position S, the transfer unit 2220 lifts up the picking-up units 2211, 2212, 2213, and 2214. After that, the picking-up units 2211, 2212, 2213, and 2214 lift up and pick up the carrier board CB at the transfer start position S, then the guide apparatus 2100 operates to release the carrier board CB.

Figure 8:
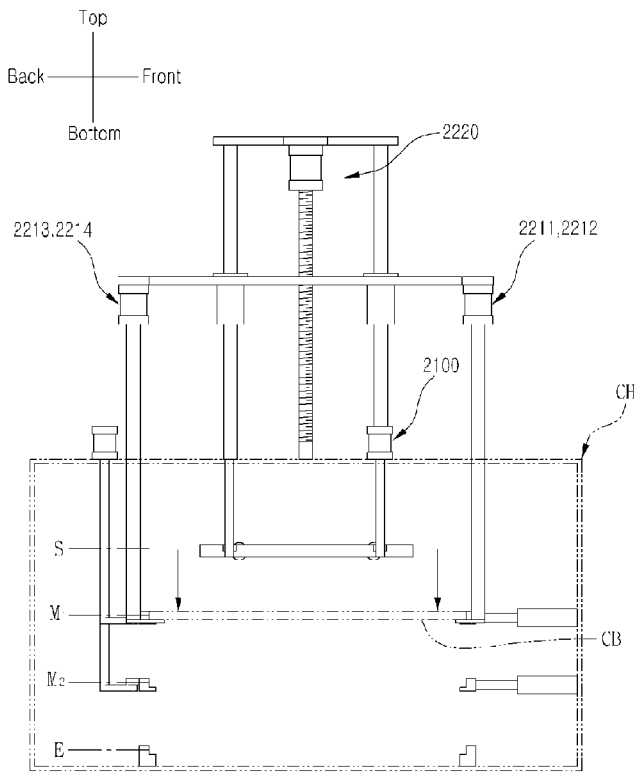
Figure 9:
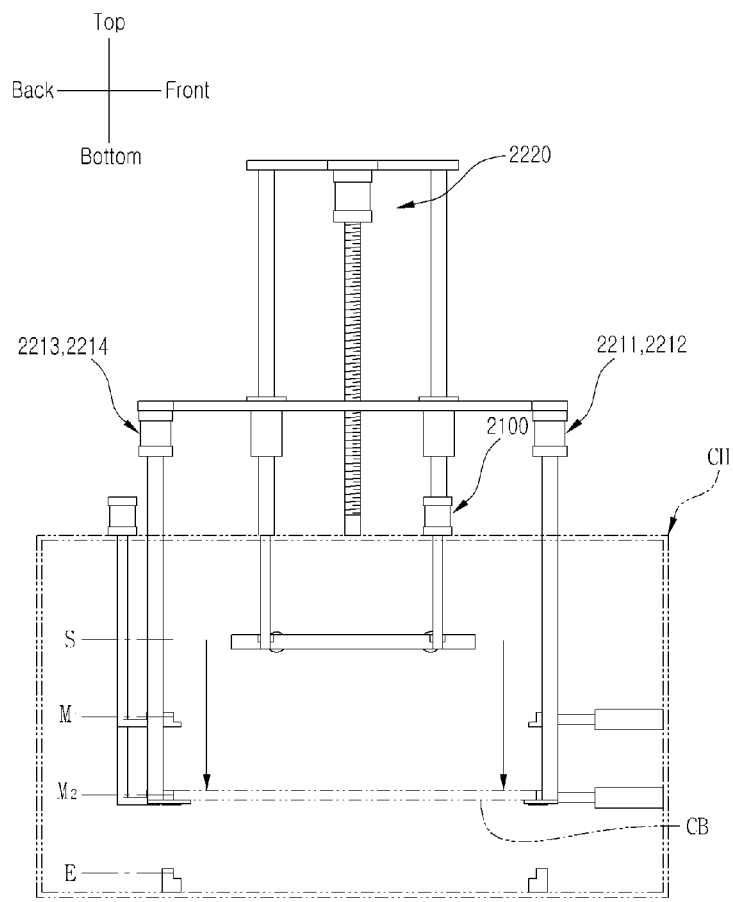
Figure 10:
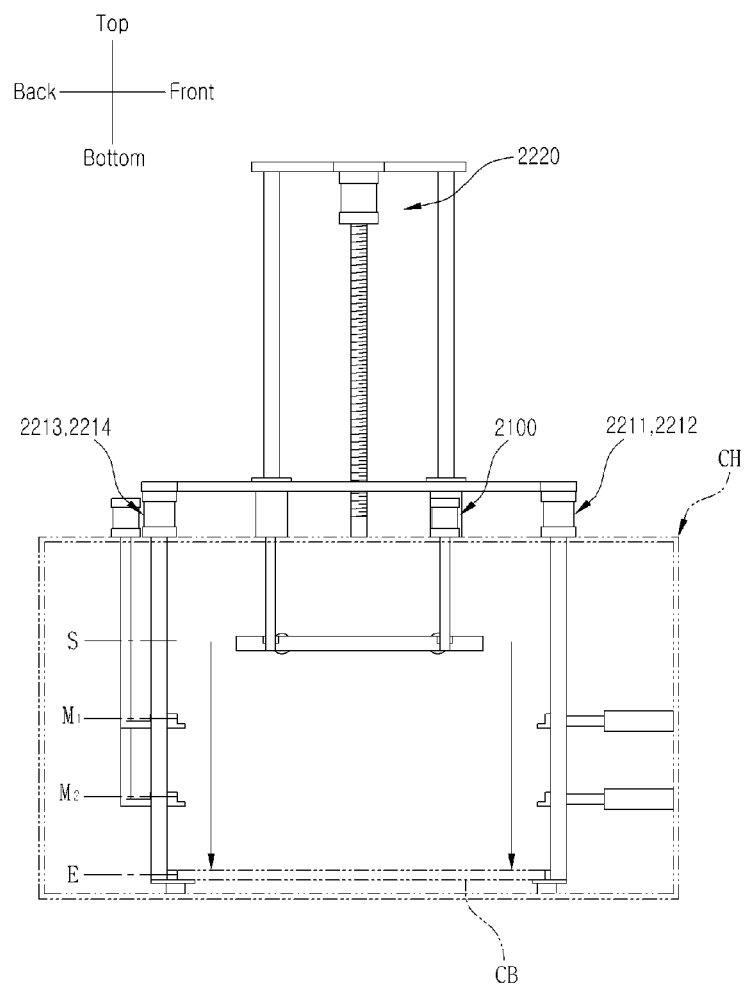

After that, when the transfer unit 2220 reversely operates to lower down the picking-up units 2211, 2212, 2213, and 2214, the picking-up units make the carrier board CB selectively lower to one of the first mid transfer position $M_1$, second mid transfer position $M_2$, and transfer final position E, as shown in FIG. 8 to FIG. 10.

For example, if carrier boards CB's circulate before the second mid transfer position $M_2$ and the transfer final position E, transfer operation is performed as shown in FIG. 8, which is called Example 1. If a carrier board CB circulates only before the transfer final position E, transfer operation is performed as shown in FIG. 9, which is called Example 2. If no carrier board CB circulates before the first and second mid transfer position $M_1$ and $M_2$ and the transfer final position E, transfer operation is performed as shown in FIG. 10, which is called Example 3.

As shown in FIG. 6, since the transfer unit 2220 can lower the following carrier board CB to a certain height according to the position of the preceding carrier board CB circulating before the following carrier board CB, it does not need a transfer stop time period at the first mid transfer position $M_1$ or at the first and second mid transfer positions $M_1$ and $M_2$, as described in Examples 2 and 3. That is, the transfer unit 2220 can transfer a carrier board CB from a certain transfer start position to a certain transfer final position without stopping.

In addition, when carrier boards CB's are located spaced apart from each other within the chamber CH, the transfer unit 2220 of FIG. 6 maintains a preceding carrier board CB at its current position and transfers the following carrier boards CB's in the circulating direction of the preceding carrier board CB, as described in Examples 1 and 2. Therefore, the transfer unit 2220 can gather the carrier boards CB's, spaced apart from each other within the chamber CH, in the circulating direction.

Furthermore, if carrier boards CB's are located at the first and second mid transfer positions $M_1$ and $M_2$, and the transfer final position E, and a carrier board CB is output from the transfer final position E to the outside through the outlet (see FIG. 1), the transfer unit 2220 of FIG. 6 sequentially transfers a carrier board CB from the second mid transfer position $M_2$ to the transfer final position E and a carrier board CB from the first mid transfer position $M_1$ to the second mid transfer position $M_2$.

3. Supporting Apparatuses 2300 and 2400

Figure 11:
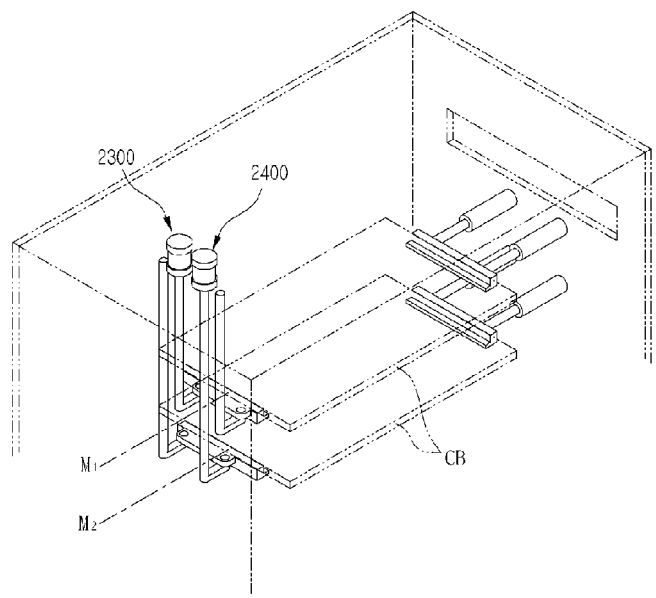
FIG. 11 is a perspective view illustrating a primary portion of the first and second supporting apparatuses adapted to the carrier board transfer system of FIG. 2.

As shown in FIG. 11, a first supporting apparatus 2300 supports or releases a carrier board CB at a first mid transfer position $M_1$ and a second supporting apparatus 2400 also supports or releases a carrier board CB at a second mid transfer position $M_2$. These first and second supporting apparatuses 2300 and 2400 are independently operated to accomplish the objective of the present invention. However, since the first and second supporting apparatuses 2300 and 2400 are identical to each other in terms of the configuration and operation, only the first supporting apparatus 2300 will be explained in the following description.

Figure 12:
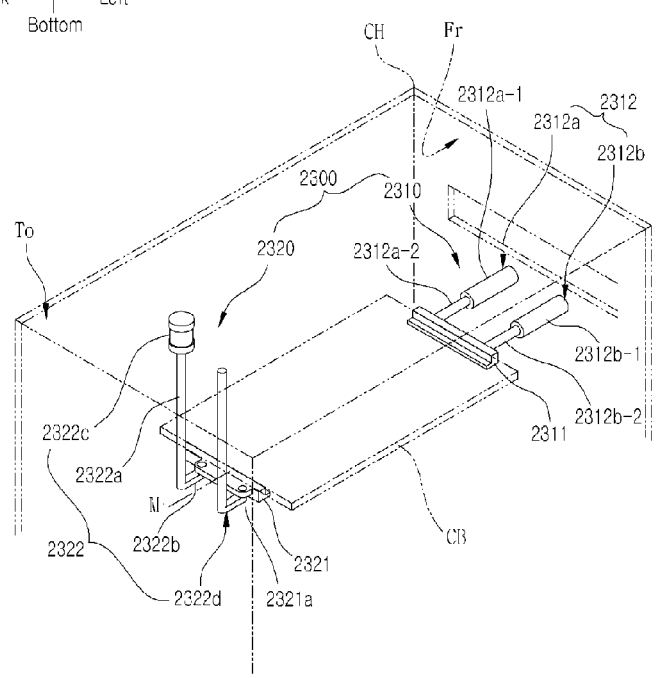
FIG. 12 is a perspective view illustrating a primary portion of the first supporting apparatus illustrated in FIG. 11.

Referring to FIG. 12, the first supporting apparatus 2300 supports or releases a carrier board CB at the first mid transfer position $M_1$. To this end, the first supporting apparatus 2300 is configured to include a first supporting part 2310 for supporting the front border portion of the carrier board CB and a second supporting part 2320 for supporting the back boarder of the carrier board CB, where the first and second supporting parts 2310 and 2320 are located at opposite sides (front and back sides) of the first supporting apparatus 2300.

The first supporting part 2310 includes a first supporting member 2311 and a first mover 2312.

The first supporting member 2311 supports the front border portion of the carrier board CB located at the first mid transfer position $M_1$ to prevent the carrier board from dropping down.

The first mover 2312 allows the first supporting member 2311 to support or release the front border portion of the carrier board CB. It includes a pair of cylinders 2312a and 2312b that are spaced apart from each other at a certain distance.

The pair of cylinders 2312a and 2312b are configured in such a way that their cylinder bodies 2312a-1 and 2312b-1 are installed to the front side wall Fr of the chamber CH outside and their cylinder rods 2312a-2 and 2312b-2 are extended through the front side wall Fr of the chamber CH and coupled to the first supporting member 2311, respectively.

The second supporting part 2320 includes a second support member 2321 and a second mover 2322.

The second supporting member 2321 supports the back border portion of the carrier board CB, located at the first mid transfer position M1 to prevent the carrier board from dropping down. It includes a coupling end 2321a that is protrudent in the back direction.

The second mover 2322 allows the second supporting member 2321 to support or release the back border portion of the carrier board CB. The second mover 2322 includes a rotational shaft 2322a, a rotational member 2322b, a drive source 2322c and an auxiliary unit 2322d.

The rotational shaft 2322a has a relatively long length in the transfer direction of the carrier board CB and is operated in such a way that its upper end is rotated, within a certain range of angle, in the forward or reverse direction, by the drive source 2322c installed to the top side wall To of the chamber CH.

The rotational member 2322b is configured in such a way that its rear end is fixed to or integrally formed with the lower end of the rotational shaft 2322a and its front end is rotatably coupled to the coupling end 2321a of the second supporting member 2321. When the drive source 2322c operates to rotate the rotational shaft 2322a in the forward or reverse direction, its front end is also rotated with respect to its rear end as a rotational axis, in the forward or reverse direction, within a certain range of angle.

The drive source 2322c is installed to the top side wall To of the chamber CH outside and rotates the rotational shaft 2322a, within a certain range of angle, in the forward and reverse direction.

The auxiliary unit 2322d assists the second supporting member 2321 to move in a balanced manner according to rotation of the rotational shaft 2322a. The auxiliary unit 2322d is the same as the auxiliary unit 2112d of the guide apparatus 2100 in terms of the configuration and operation, so a detailed description of its features will be omitted.

Since the operation of the first and second supporting apparatuses 2300 and 2400 is substantially the same as that of the guide apparatus 2100 described above, further description is omitted.

4. Sustaining Apparatus 2500

The sustaining apparatus 2500 supports a carrier board CB at the transfer final position E. As shown in FIG. 2, it includes a first sustaining part 2510 for sustaining the front border portion of the carrier board CB and a second sustaining part 2520 for sustaining the back border portion of the carrier board CB.

The sustaining apparatus 2500 can be formed in such a way to sustain the carrier board CB. Although the present embodiment is implemented to include the sustaining apparatus 2500, it may be modified in such a way that part of the bottom surface of the chamber CH is protruded to sustain the carrier board CB without using the sustaining apparatus 2500. Since the sustaining apparatus 2500 can also be individually prepared, it is not an essential element for the transfer system 2000 according to the present invention.

5. Description about Features Related to Repair Service

When a jam occurs in the chamber CH, it is required that a carrier board CB should be enforcedly output from the chamber CH.

When a jam occurs, the carrier board CB supported by the guide apparatus 2100 can be enforcedly removed from the inlet at the front side wall Fr of the chamber CH. In this case, it is preferable that the chamber CH has a door to open its whole left side wall Le, as shown in FIG. 2. If another chamber is adjacently located to the right side of the chamber CH, a carrier board CB, supported by the first and second supporting apparatuses 2300 and 2400 and the sustaining apparatus 2500, should be removed through the left side wall Le of the chamber CH.

This configuration means that the drive source 2112c of the first spacing regulator 2112 cannot be installed to the left side wall Le of the chamber CH, as shown in FIG. 3. Therefore, unlike the second spacing regulator 2122, the first spacing regulator 2112 is configured in such a way that its drive source 2112c can be installed to the top side wall To of the chamber CH.

Although the chamber CH is implemented to include a door that can open its whole left side wall Le, this may causes difficulties if parts of other apparatuses cannot be replaced or repaired through the door. Therefore, it is preferable that the chamber CH is implemented to have a door that can open its whole back side wall Re (see FIG. 2).

Therefore, as shown in FIG. 12, unlike the first mover 2312, the second mover 2322 is configured in such a way that its drive source 2322c is installed to the top side wall To of the chamber CH.

6. Description of Features Related to the Entrance of the Carrier Board

Figure 13:
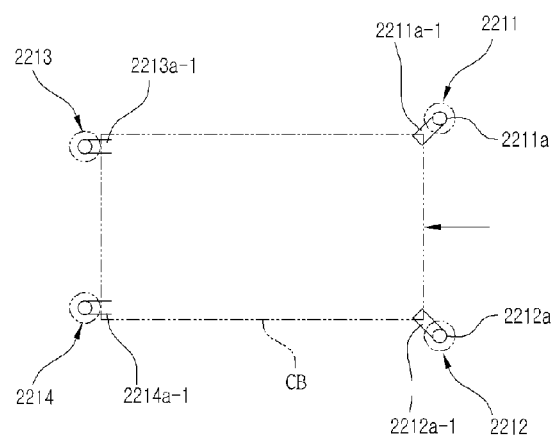
FIG. 13 is a view illustrating the repair service features of the carrier board transfer system, according to an embodiment of the present invention.

FIG. 13 is a view illustrating two pairs of picking-up units 2211/2212 and 2213/2214 of FIG. 6, seen from top. Referring to FIG. 13, the picking-up ends 2212a-1 and 2214a-1 of the pair of back side picking-up units 2213 and 2214 support the back side border portion of the carrier board CB. The picking-up ends 2211a-1 and 2212a-1 of the pair of front side picking-up units 2211 and 2212 support the front corners of the carrier board CB in the diagonal direction.

This configuration is to prevent a carrier board CB, which is input through the inlet and entered inside the chamber, from interfering with the picking-up shafts 2211a and 2212a and also to prevent a carrier board CB, which is removed through the left side wall Le when repairing, from interfering with the picking-up shaft 2212a. In that case, the picking-up shaft 2211a at the front right side may support the carrier board CB not in the diagonal direction but in the right direction.

Application Example of Embodiment 1

Embodiment 1 is implemented in such a way that one picking-up shaft (2211a; 2212a; 2213a; and 2214a) has only one picking-up end (2211a-1; 2212a-1; 2213a-1; and 2214a-1), respectively and correspondingly. However, as shown in FIG. 14, Embodiment 1 may be modified in such a way that one picking-up shaft (2211a-0; 2212a-0; 2213a-0; and 2214a-0) has two picking-up ends (2211a-01 and 2211a-02; 2212a-01 and 2212a-02; 2213a-01 and 2213a-02; and 2214a-01 and 2214a-02), respectively and correspondingly.

Figure 14:
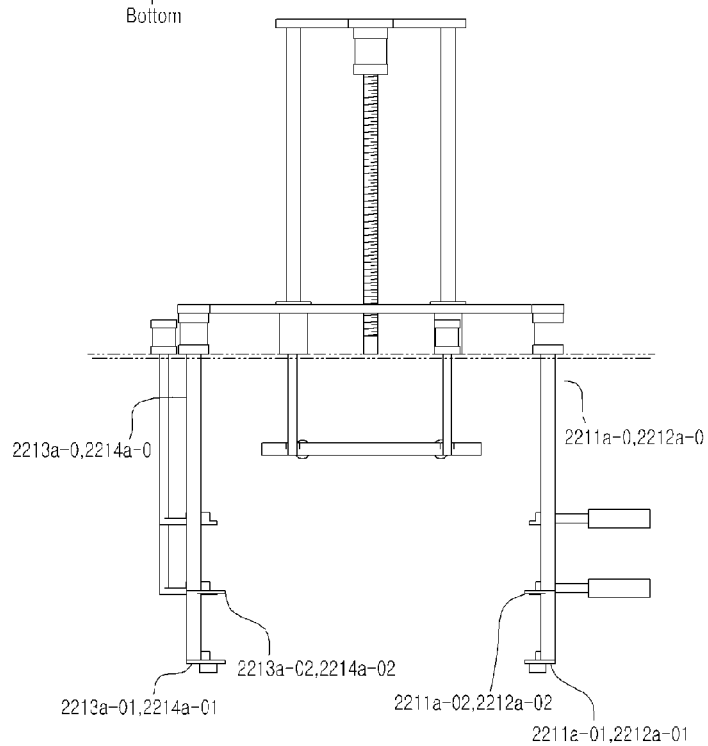
FIG. 14 is a schematic view illustrating an application example of the transfer apparatus illustrated in FIG. 6.
Figure 15:
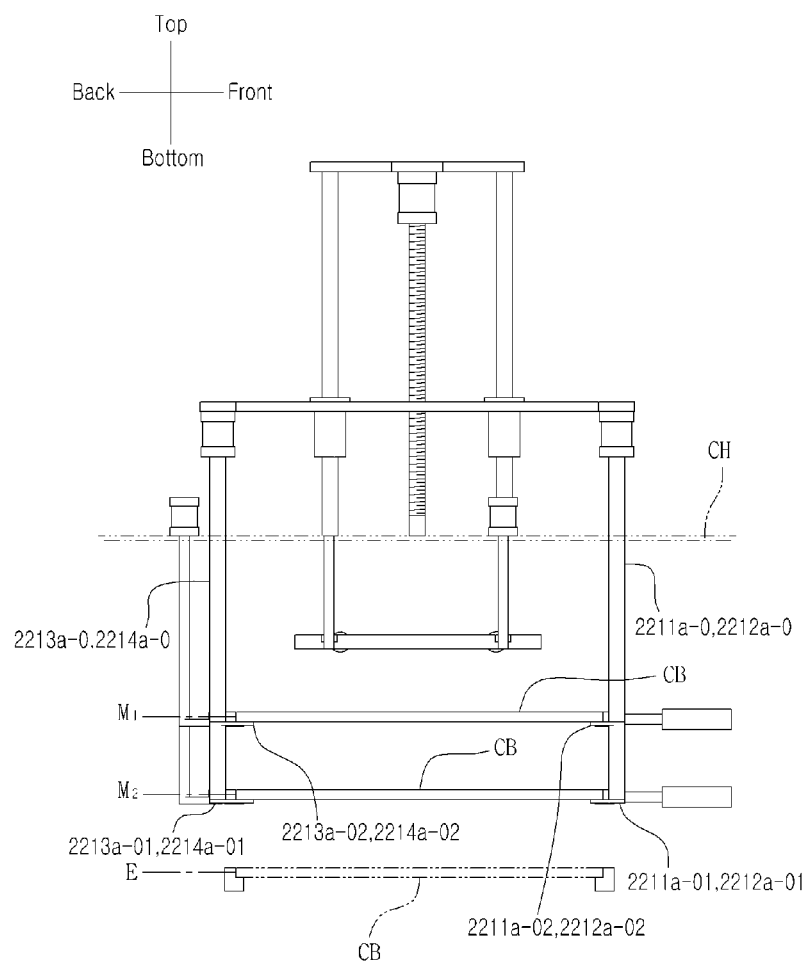
FIG. 15 is a view illustrating the operation state of the transfer apparatus illustrated in FIG. 14.

The application example of FIG. 14 has the following advantages. As shown in FIG. 15, there is a case where a carrier board CB at the transfer final position E should be output to the outside of the chamber CH and then two carrier boards CB s should be transferred from the first and second mid transfer positions $M_1$ and $M_2$ to the second mid transfer position $M_2$ and the transfer final position E, respectively. To this end, it will be appreciated that one picking-up shaft (2211a-0; 2212a-0; 2213a-0; and 2214a-0) is configured to have two picking-up ends (2211a-01 and 2211a-02; 2212a-01 and 2212a-02; 2213a-01 and 2213a-02; and 2214a-01 and 2214a-02), respectively and correspondingly, thereby simultaneously transferring two carrier boards CB s. It should be understood that the present invention may be implemented in such way that each picking-up shaft has three picking-up ends.

Although Embodiment 1 is implemented in such a way that four carrier boards CB s are located in the chamber CH, it should be understood that it may be modified in such a way that the chamber CH locates five or more carrier boards CB s therein. In that case, it will be appreciated that each picking-up shaft may have three or more picking-up ends.

Embodiment 2

Figure 16:
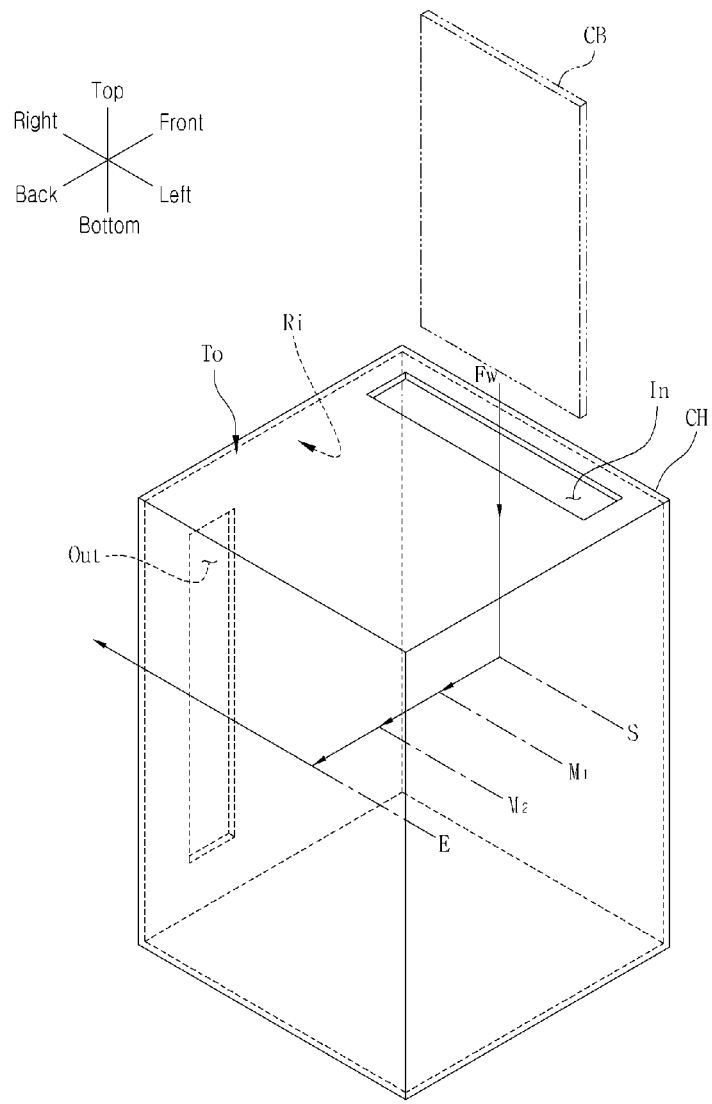
FIG. 16 is a schematic perspective view illustrating a chamber to which a carrier board transfer method according to a second embodiment of the present invention is applied.

FIG. 16 shows a chamber CH where a carrier board CB is transferred in the transfer section, along the transfer flow $F_w$ indicated by the arrow, maintaining its vertical state, different from Embodiment 1.

Referring to FIG. 16, the carrier board CB enters a front portion of the top side wall To of the chamber CH in the vertical direction and then is located at a transfer start position S. After that, the carrier board CB is transferred from the transfer start position S through a first and second mid transfer positions $M_1$ and $M_2$ to the transfer final position E, i.e., from the front side of the chamber CH to the back side, and then output from the transfer final position E to the outside of the chamber CH through a rear portion of the right side wall Ri of the chamber CH.

In order to transfer the carrier board CB along the transfer flow Fw as shown in FIG. 16, the chamber CH has an inlet at the front portion of the top side wall To thereof and an outlet at the rear portion of the right side wall Ri thereof. The inlet is implemented in such a way to be opened or closed by a door (not shown).

Figure 17:
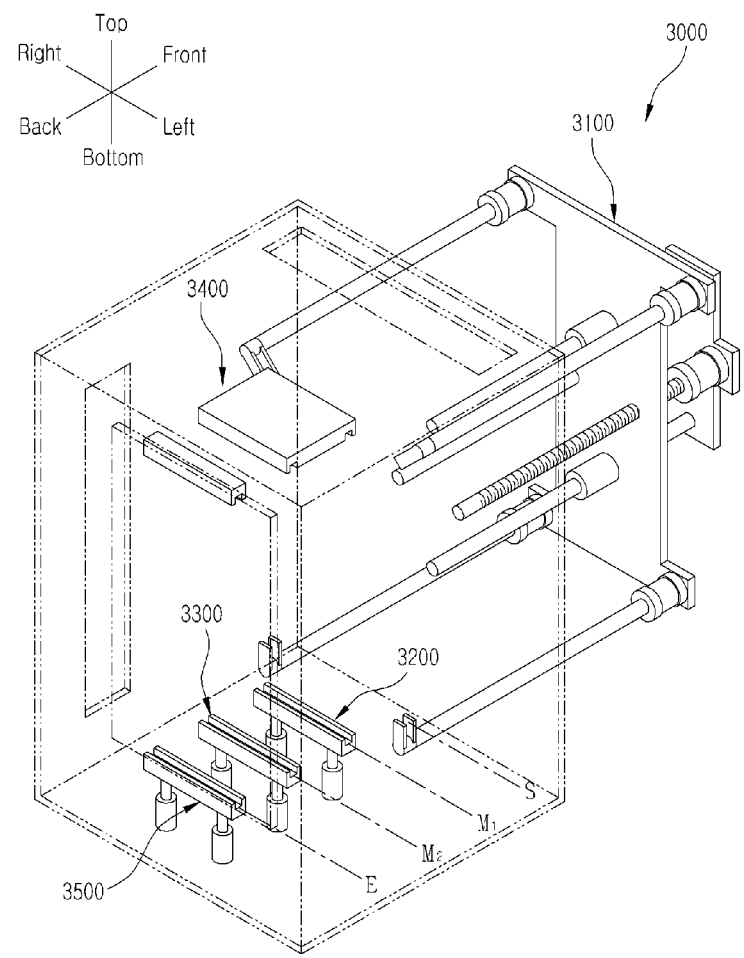
FIG. 17 is a schematic perspective view illustrating a carrier board transfer system according to a second embodiment of the present invention.

FIG. 17 is a perspective view illustrating a carrier board transfer system 3000 that transfers a carrier board CB within the chamber CH shown in FIG. 16.

As shown in FIG. 17, the transfer system 3000 according to an embodiment of the present invention is configured to include a transfer apparatus 3100, a first supporting apparatus 3200, a second supporting apparatus 3300, a supporting plate 3400, and a sustaining apparatus 3500.

1. Transfer Apparatus 3100

Figure 18:
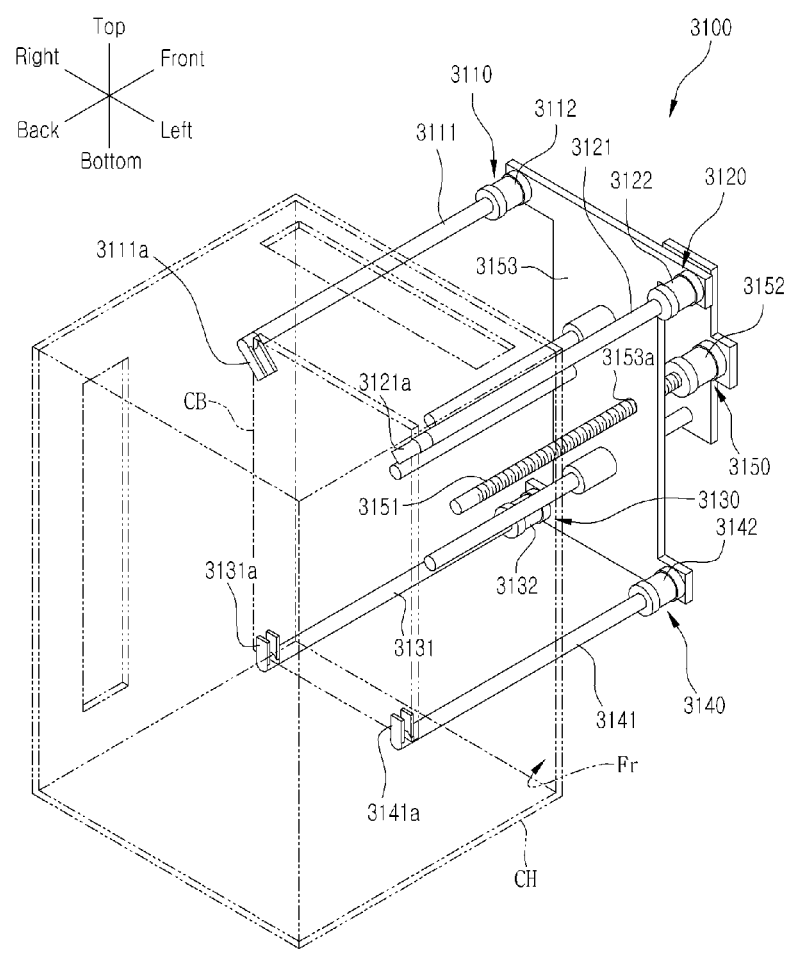
FIG. 18 is a perspective view illustrating a primary portion of a transfer apparatus adapted to a carrier board transfer system illustrated in FIG. 17.

The transfer apparatus 3100 transfers a carrier board CB from the transfer start position S to the transfer final position E in the rear side. To this end, as shown in FIG. 18, the transfer apparatus 3100 includes a pair of picking-up units 3110 and 3120 at its upper side, a pair of picking-up units 3130 and 3140 at its lower side, and a transfer unit 3150.

The four picking-up units 3110, 3120, 3130, and 3140 include picking-up shafts 3111, 3121, 3131, and 3141 and drive sources 3112, 3122, 3132, and 3142, correspondingly and respectively. The transfer unit 3150 is configured to include a screw shaft 3151, a motor 3152, and a coupling plate 3153.

The picking-up shafts 3111, 3121, 3131, and 3141 each have a relatively long length in the front-back direction, extending through the front side wall Fr of the chamber CH. They have picking-up ends 3111a, 3121a, 3131a, and 3141a at their rear ends, correspondingly and respectively, which are protrudently formed as the Korean letter 'ㄷ' called Digeut in Korean, to support the border portions or corners of the carrier board CB.

The drive sources 3112, 3122, 3132 and 3142 are installed to couple to the coupling plate 3153 located at the front side of the chamber CH. The driver sources rotate the picking-up shafts 3111, 3121, 3131, and 3141, within a certain range of angle, in the forward or reverse direction.

The screw shaft 3151 has a relatively long length in the transfer direction of a carrier board CB, i.e., in the front-back direction, and is configured in such a way that its rear end is rotatably coupled to the front side wall Fr of the chamber CH and its front end is coupled to the motor 3152 and rotated according to the rotation of the motor 3152.

The motor 3152 is fixedly provided to rotate the screw shaft 3151 in the forward or reverse direction.

The coupling plate 3153 is configured in such a way that: its both end portions of the upper and lower sides are coupled to the drive sources 3112, 3122, 3132, and 3142 of the picking-up units 3110, 3120, 3130, and 3140; and its center has a screw hole 3153a through which the screw shaft 3151 is extended.

Since the Embodiments 1 and 2 are similar to each other in terms of configuration and operation process but they are different from each other in that the transfer apparatus 3100 in Embodiment 2 transfers the carrier board CB in a vertical state and the transfer apparatus 2100 in Embodiment 1 transfers the carrier board in a horizontal state, a detailed description of the operation of the transfer apparatus 3100 is omitted in the following description.

2. Supporting Apparatuses 3200 and 3300 and Supporting Plate 3400

The first supporting apparatus 3200 supports or releases the lower border portion of a carrier board CB at a first mid transfer position $M_1$. The second supporting apparatus 3300 supports or releases the lower border portion of a carrier board CB at a second mid transfer position $M_2$. The supporting plate 3400 supports the upper border portions of the carrier boards CB's at the first and second mid transfer positions $M_1$ and $M_2$.

Since the first and second supporting apparatus 3200 and 3300 are identical to each other in terms of the configuration and operation, only the first supporting apparatus 3200 is explained in detail in the following description.

Figure 19:
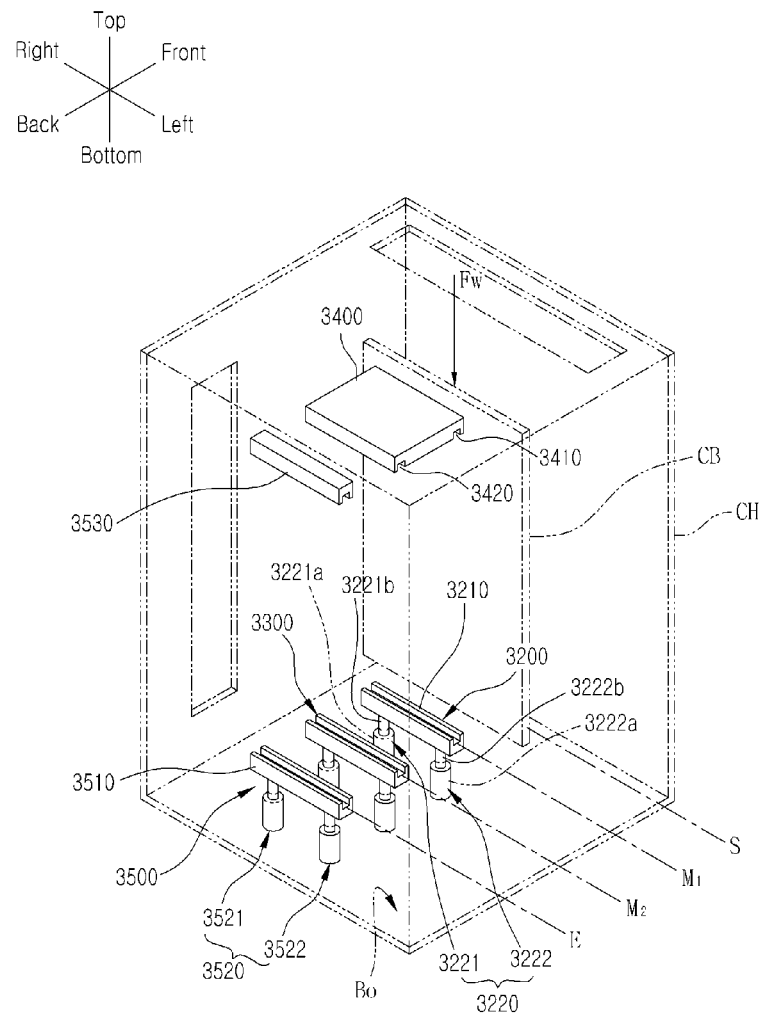
FIG. 19 is a perspective view illustrating the remaining portions except for the transfer apparatus of the carrier board transfer system illustrated in FIG. 17.

Referring to FIG. 19, the first supporting apparatus 3200 includes a supporting member 3210 and a mover 3220.

The supporting member 3210 supports the lower border portion of the carrier board CB, located at the first mid transfer position $M_1$ to prevent the carrier board from dropping down.

The mover 3220 allows the supporting member 3210 to support or release the lower border portion of the carrier board CB. The mover 3220 includes a pair of cylinders 3221 and 3222 that are spaced apart from each other at a certain distance.

The pair of cylinders 3221 and 3222 are configured in such a way that their cylinder bodies 3221a and 3222a are installed to the lower side wall Bo of the chamber CH outside and their cylinder rods 3221b and 3222b are extended through the lower side wall Bo of the chamber CH and coupled to the supporting member 3210, respectively.

The supporting plate 3400 is fixedly located above and opposite to the first and second supporting apparatuses 3200 and 3300. The supporting plate 3400 also has supporting grooves 3410 and 3420 corresponding to the first and second mid transfer positions $M_1$ and $M_2$, respectively. The supporting grooves 3410 and 3420 receive the upper border portions of carrier boards CB s, respectively.

The first and second supporting apparatuses 3200 and 3300 and the supporting plate 3400 in Embodiment 2 correspond to the first and second supporting apparatuses 2300 and 2400 in Embodiment 1, but they differ from each other in terms of configuration.

In order to support the carrier boards CB's at the first and second mid transfer positions $M_1$ and $M_2$, the first and second supporting apparatuses 3200 and 3300 and the supporting plate 3400 in Embodiment 2 may also be implemented to be the same as the configuration of Embodiment 1. However, the configuration difference between Embodiments 1 and 2 are related to the posture of the carrier board CB to be transferred.

In general, if a carrier board CB is transferred in a vertical state within the chamber CH, the transfer system is equipped with a posture change apparatus (not shown) at its upper side, so that the carrier board CB changes its posture by the posture change apparatus and then is lowered to the transfer start position S.

In such a transfer system where the carrier board CB is transferred in a vertical state within the chamber CH, if the upper border portion of the carrier board CB is supported or released by the drive force of the drive source, the space for the installation of the drive source and the space for the ascending and descending range of the ascending/descending element (the supporting member) does not allow for the installation space for the posture change apparatus. Therefore, in this case, a complicated design is required or it is not possible to secure a space for the installation of the posture change apparatus.

To resolve this problem, the transfer system 3000 of Embodiment 2 is implemented in such a way that the supporting plate 3400 whose location is fixed supports the upper border portion of the carrier board CB.

3. Sustaining Apparatus 3500

The sustaining apparatus 3500 supports a carrier board CB at the transfer final position E. As shown in FIG. 19, it includes a first sustaining part 3510, an ascending/descending unit 3520, and a second sustaining part 3530.

The first sustaining part 3510 sustains the lower border portion of the carrier board CB at the transfer final position E.

The ascending/descending unit 3520 lifts up or lowers the first sustaining part 3510 so as not to interfere with the carrier board CB that is being transferred to the transfer final position E. It includes a pair of cylinders 3521 and 3522.

The second sustaining part 3530 sustains the upper border portion of the carrier board CB at the transfer final position E.

It should be understood that the present embodiment can be implemented by using a moving rail that can lift up the carrier board CB at the transfer final position E to a certain height, instead of the sustaining apparatus. That is, since the sustaining apparatus 3530 can be implemented to be separate from the transfer system, it is not an essential element for the present invention.

4. Operation of Transfer System and Transfer Method

Figure 20:
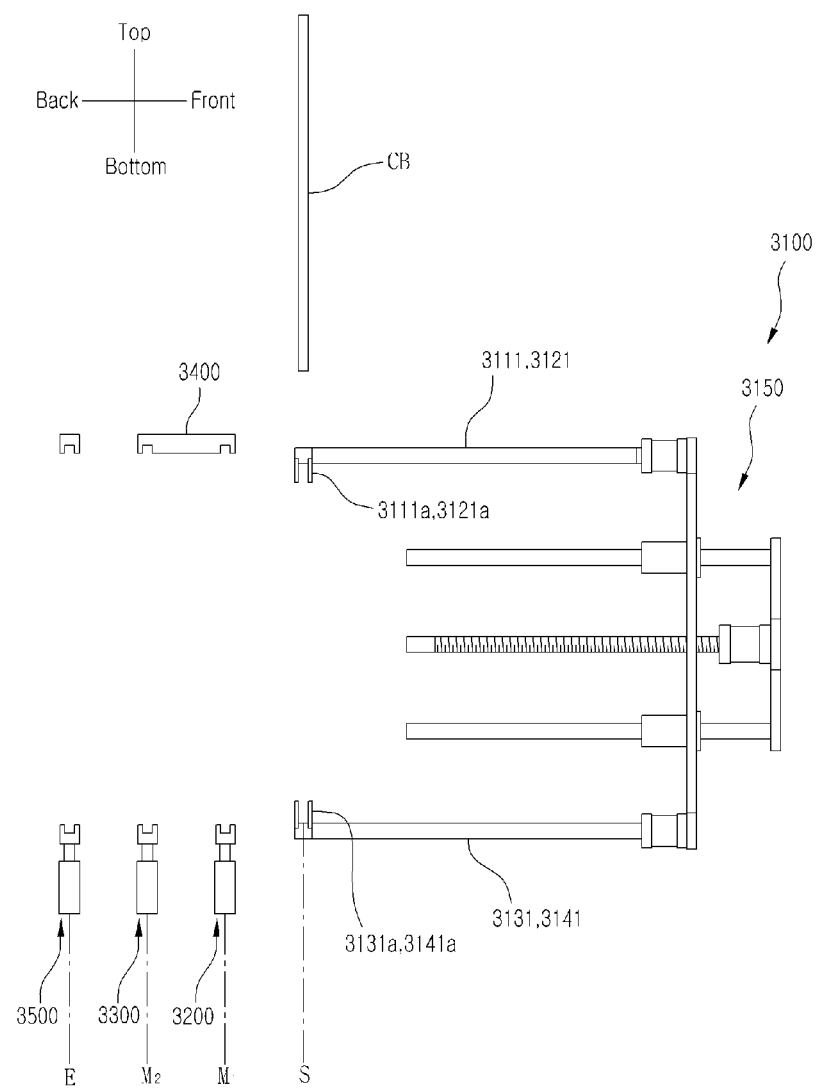
FIG. 20 to FIG. 23 show views that illustrate the operations of the carrier board transfer system illustrated in FIG. 17.

Referring to FIG. 20, before a carrier board CB is lowered to the transfer start position S, the transfer unit 3150 is previously operated so that the picking-up ends 3111a, 3121a, 3131a, and 3141a of the picking-up shafts 3111, 3121, 3131, and 3141 can guide and support the carrier board CB to be located at the transfer start position S.

Figure 21:
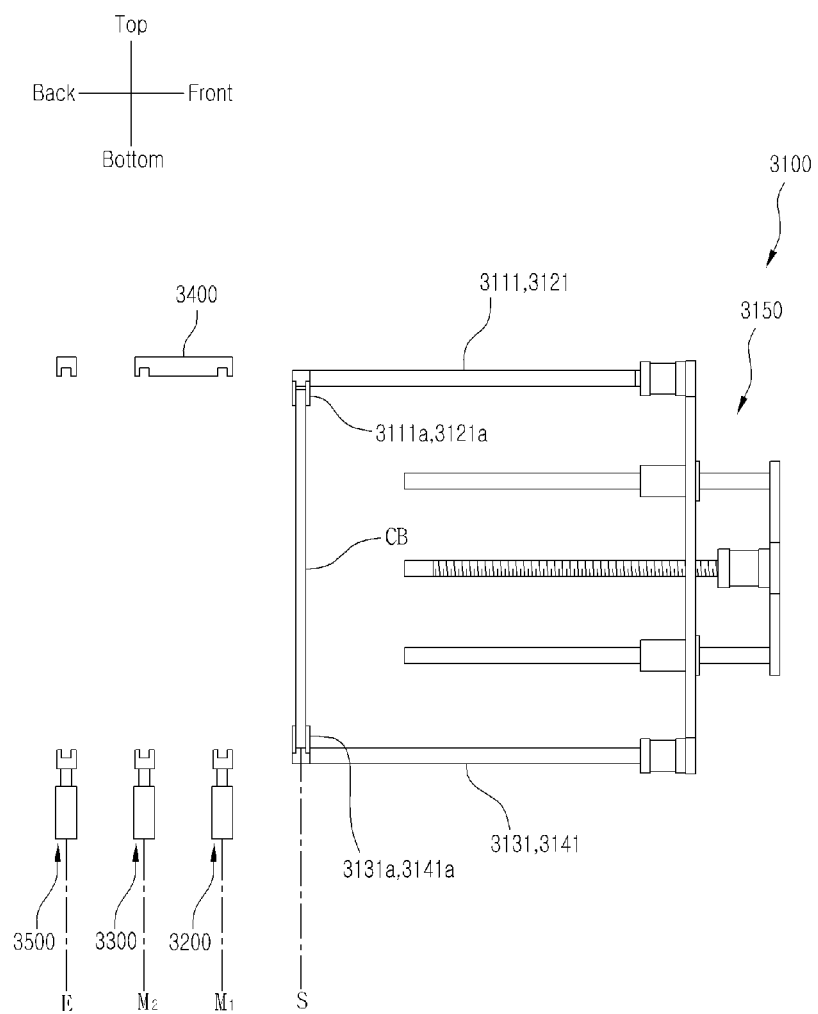

When the carrier board CB in a vertical state, as shown in FIG. 20, is lowered and enters inside the chamber CH, its lower border portion and both left and right borders of its upper end portion are properly supported by the picking-up ends 3111a, 3121a, 3131a, and 3141a of the picking-up shafts 3111, 3121, 3131, and 3141, as shown in FIG. 21. Since the transfer system 3000 of Embodiment 2 is operated in such way that the picking-up ends 3111a, 3121a, 3131a, and 3141a lower the carrier board CB to the transfer start position S or guide and support the carrier board CB located at the transfer start position S, it does not need the guide apparatus 2100 of Embodiment 1. However, the transfer system 3000 of Embodiment 2 may further include such a guide apparatus to enhance the transfer speed of a carrier board CB. For example, a guide apparatus 3100 may be selectively included in the transfer system 3000 according to whether to transfer a carrier board CB in the up-down direction or in the front-back direction or according to the transfer speed of a carrier board CB.

As described in Embodiment 1, the transfer unit 3150 operates to transfer a carrier board CB selectively to one of the first mid transfer position $M_1$, the second mid transfer position $M_2$, and the transfer final position E. In the following description, the process where the carrier board CB is transferred step by step is explained to clearly illustrate the operation of the transfer system 3000 according to the present invention.

Figure 22:
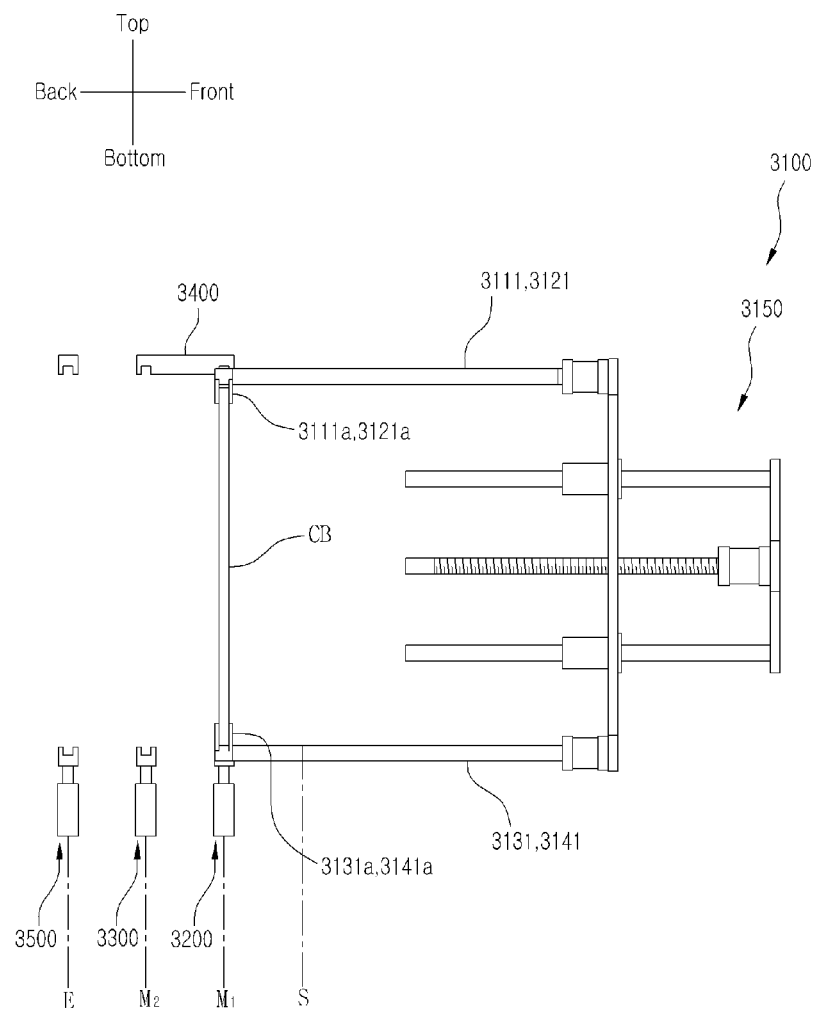
Figure 23:
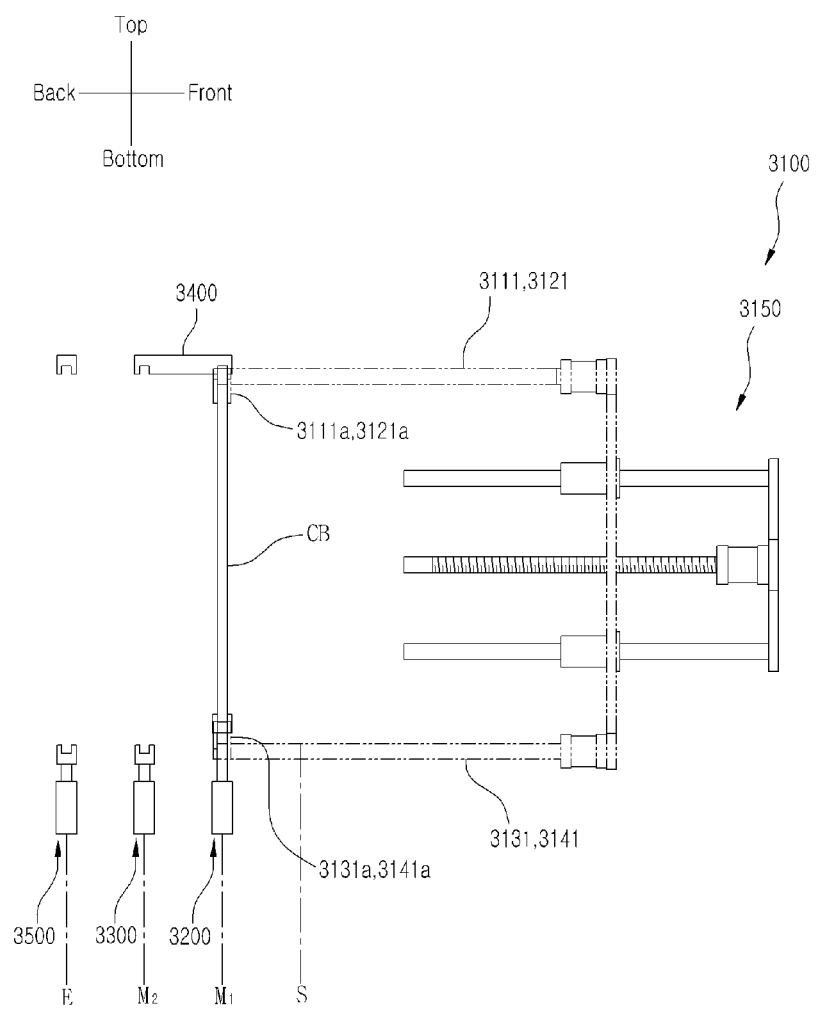

For example, if the transfer unit 3150 in a state shown in FIG. 21 operates to transfer a carrier board CB to the first mid transfer position $M_1$ as shown in FIG. 22, the first supporting apparatus 3200, as shown in FIG. 23, operates to support and lift up the carrier board CB, so that the upper border portion of the carrier board CB is inserted into the supporting groove 3410. That is, as shown in FIG. 23, the lower border portion of the carrier board CB is supported by the supporting member 3210 of the first supporting apparatus 3200 and the upper border portion of the carrier board CB is supported by the supporting plate 3400.

As described above, the method for transferring a carrier board CB from the transfer start position S to the first mid transfer position $M_1$ can be identically applied to the case where the carrier board CB is transferred from the first mid transfer position M1 to the second mid transfer position $M_2$ and the case where the second mid transfer position $M_2$ is transferred to the transfer final position E. This method can be also applied to the case where a carrier board CB is continuously transferred from the transfer start position S to the second mid transfer position $M_2$ or the transfer final position E or from the first mid transfer position $M_1$ to the transfer final position E, without the transfer stop time.

In an embodiment of the present invention, while the carrier board CB is transferring, the transfer system simultaneously performs ascending and descending motions, i.e., a reciprocating motion perpendicular to the transfer direction of the carrier board CB.

<Additional Description>

In general, a carrier board CB is transferred, step by step, within a soak chamber or a de-soak chamber of a handler. This, as one of the reasons, is to secure sufficient time period for the electronic devices loaded onto the carrier board to be assimilated to an environment that is artificially prepared in the chamber.

Therefore, the soak chamber or the de-soak chamber should be implemented to include a plurality of carrier boards, and perform a step-by-step transfer operation.

In order to increase an amount of processing, the surface for loading electronic devices onto a carrier board should be increased and the handler size should be reduced. However, the loading surface increase and the handler size reduction make it impossible to accomplish a configuration where a plurality of carrier boards received in the soak chamber or the de-soak chamber are transferred maintaining a state where they are aligned and parallel to the loading surface.

Therefore, the system is implemented in such a way that the carrier boards can be transferred, in a soak chamber or a de-soak chamber, in a direction that is perpendicular to the loading surface of electronic devices.

Thus, the present invention can be applied to a technology where the carrier boards are transferred inside the chamber. According to the present invention, the carrier boards can be transferred in a direction perpendicular to a loading surface for electronic devices.

Although exemplary embodiments of the present invention have been described in detail hereinabove, it should be understood that many variations and modifications of the basic inventive concept herein described, which may appear to those skilled in the art, will still fall within the spirit and scope of the exemplary embodiments of the present invention as defined in the appended claims.

INDUSTRIAL APPLICABILITY

The present application can be applied to the technical field of the apparatus for testing electric devices.

The invention claimed is:

1. A system for transferring a carrier board in a chamber of a handler that supports the testing of electronic devices, comprising:
   - an transfer apparatus for transferring the carrier board at a transfer start position selectively to one of at least one or more mid transfer positions and a transfer final position; and
   - at least one or more supporting apparatuses for supporting or releasing the carrier board located at the at least one or more mid transfer positions so that a carrier board transferred to one of at least one or more mid transfer positions by the transfer apparatus is supported on a corresponding supporting apparatus and a carrier board to be transferred by the transfer apparatus to another of at least one or more mid transfer positions or the transfer final position is released from the corresponding supporting apparatus,
   - wherein the transfer apparatus is configured to transfer the carrier board at the transfer start position selectively to one of at least the one or more mid transfer positions and the transfer final position without transfer stop time period, respectively, and wherein, if carrier boards in the chamber are located spaced apart from each other without transferring outside the chamber allowing no carrier board exists at one or more mid transfer positions, the transfer apparatus is configured to maintain a preceding carrier board at current position thereof and to transfer a following carrier board in a circulating direction of the preceding carrier board to gather the carrier boards located spaced apart from each other in the chamber.

2. The system according to claim 1, further comprising:
   a guide apparatus for guiding the carrier board transferred to the transfer start position from outside of the chamber and supporting or releasing the carrier board located at the transfer start position.

3. The system according to claim 1, further comprising:
   a sustaining apparatus for sustaining a carrier board at the transfer final position.

4. The system according to claim 1, further comprising:
   a supporting plate, fixed to the system, for supporting one side border portion of the carrier board,
   wherein the supporting apparatus comprises:
   a supporting member for supporting or releasing the other side border portion of the carrier board; and
   a mover for moving the supporting member in a direction to or from the carrier board.

5. The system according to claim 1, wherein in the case that the system has a plurality of the support apparatuses, the supporting apparatuses are operated, independently and respectively.

6. The system according to claim 1, wherein the transfer apparatus comprises:
   at least two or more picking-up units for picking up or releasing the carrier board; and
   a transfer unit for transferring the at least two or more picking-up units in a transfer direction of the carrier board so that the carrier board, which is picked up by the at least two or more picking-up units, can be transferred selectively to one of the at least one or more mid transfer positions and the transfer final position.

7. The system according to claim 6, wherein the picking-up unit comprises:
   a picking-up shaft having a relatively long length in the transfer direction of carrier board; and
   a drive source for rotating the picking-up shaft, within a certain range of angle, in the forward or reverse direction,
   wherein the picking-up shaft is configured in such a way that its one end is coupled to the drive source and its other end includes at least one or more picking-up ends that are protruded to support the border portions or corners of the carrier board.

8. The system according to claim 6, wherein the transfer unit comprises:
   a screw shaft having a relatively long length in the transfer direction of carrier board;
   a motor for rotating the screw shaft, within a certain range of angle, in the forward or reverse direction; and
   a coupling plate,
   wherein
   the coupling plate is coupled to the screw shaft in a screw manner and reciprocated in the transfer direction of carrier board according to the rotation of the screw shaft; and
   the at least two or more picking-up units are coupled to the coupling plate.

* * * * *